US011533812B2

(12) United States Patent
Yu et al.

(10) Patent No.: US 11,533,812 B2
(45) Date of Patent: Dec. 20, 2022

(54) BONDING METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yong Yu, Beijing (CN); Chang Zhang, Beijing (CN); Lixia Shen, Beijing (CN)

(73) Assignees: CHENGDU BOE OPTOELECTRONICS TECHNOLOGY CO., LTD., Sichuan (CN); Beijing BOE Technology Development Co., Ltd., Beijing (CN)

( * ) Notice: Subject to any disclaimer, the term of this patent is extended or adjusted under 35 U.S.C. 154(b) by 349 days.

(21) Appl. No.: 16/825,172

(22) Filed: Mar. 20, 2020

(65) Prior Publication Data
US 2021/0168946 A1 Jun. 3, 2021

(30) Foreign Application Priority Data

Nov. 29, 2019 (CN) .......................... 201911203346.0

(51) Int. Cl.
G06F 3/038 (2013.01)
H05K 3/36 (2006.01)
H05K 1/11 (2006.01)
H05K 1/14 (2006.01)

(52) U.S. Cl.
CPC ............ *H05K 3/361* (2013.01); *H05K 1/118* (2013.01); *H05K 1/147* (2013.01)

(58) Field of Classification Search
CPC ........ G05K 3/361; H05K 1/118; H05K 1/147; G09G 5/00; G06F 3/038
See application file for complete search history.

(56) References Cited

U.S. PATENT DOCUMENTS

| | | | |
|---|---|---|---|
| 2013/0201640 A1* | 8/2013 | Kim | H05K 1/02 361/749 |
| 2020/0015356 A1* | 1/2020 | Park | H05K 1/147 |
| 2020/0107447 A1* | 4/2020 | Sakamoto | H05K 1/189 |
| 2021/0105901 A1* | 4/2021 | Jang | H01R 43/02 |

* cited by examiner

*Primary Examiner* — Pegeman Karimi
(74) *Attorney, Agent, or Firm* — Nath, Goldberg & Meyer; Joshua B. Goldberg

(57) ABSTRACT

The disclosure provides a bonding method, the bonding method includes: bonding first areas of a plurality of flexible printed circuit boards on a substrate, the plurality of flexible printed circuit boards being sequentially arranged along a direction parallel to a first side of the substrate, and a second area of each of the flexible printed circuit boards exceeds the first side; cutting at least one of the flexible printed circuit boards to enable second sides of all the flexible printed circuit boards to be flush and parallel to the first side, wherein each of the second sides is a side of the second area away from the first area; and bonding second areas of the flexible printed circuit boards with a connection circuit board.

12 Claims, 3 Drawing Sheets

BONDING METHOD

CROSS REFERENCE TO RELATED DISCLOSURE

The present disclosure claims priority to Chinese patent publication No. 201911203346.0, filed on Nov. 29, 2019, the disclosure of which is incorporated herein by reference.

TECHNICAL FIELD

The present disclosure relates to the field of display technology, and in particular, to a bonding method.

BACKGROUND

The AMOLED (Active-matrix Organic Light-emitting Diode) display technology has advantages of fast response speed, high contrast, wide viewing angle, self-luminescence, power saving, etc., and is widely used in flexible display devices.

DISCLOSURE OF INVENTION

An embodiment of the present disclosure provides a bonding method, including: bonding first areas of a plurality of flexible printed circuit boards on a substrate, the plurality of flexible printed circuit boards being sequentially arranged along a direction parallel to a first side of the substrate, and a second area of each of the flexible printed circuit boards exceeds the first side; cutting at least one of the flexible printed circuit boards to enable second sides of all the flexible printed circuit board to be flush and parallel to the first side, wherein each of the second sides is a side of the second area away from the first area; and bonding second areas of the flexible printed circuit boards with a connection circuit board.

In an embodiment, the cutting at least one of the flexible printed circuit boards includes: cutting by taking an extension line of the second side of a reference flexible printed circuit board as a cutting line so as to enable all the second sides of the flexible printed circuit boards to be flush with the extension line after cutting, wherein among the flexible printed circuit boards, a distance from the second side of the reference flexible printed circuit board to the first side of the substrate is the shortest.

In an embodiment, the second area of at least one of the flexible printed circuit board is provided with at least one alignment mark, and each alignment mark defines a straight line parallel to the second side.

In an embodiment, the cutting at least one of the flexible printed circuit boards includes: cutting by taking a straight line defined by a selected alignment mark as a cutting line, so that the second sides of all the flexible printed circuit boards are flush with the straight line defined by the selected alignment mark.

In an embodiment, the second area of at least one of the flexible printed circuit boards is provided with a plurality of alignment marks, and different alignment marks of a single flexible printed circuit board defines straight lines with different distances to the second side of the flexible printed circuit board.

In an embodiment, the plurality of alignment marks on the single flexible printed circuit board define a plurality of straight lines which are equally spaced.

In an embodiment, the plurality of alignment marks on the single flexible printed circuit board are sequentially arranged along a straight line perpendicular to the second side.

In an embodiment, the second area of each of the flexible printed circuit boards is provided with a plurality of output pads which are sequentially arranged along the direction parallel to the second side.

In an embodiment, each of the output pads is throughout the second area in a direction perpendicular to the second side.

In an embodiment, the plurality of flexible printed circuit boards are bonded to a single connection circuit board.

In an embodiment, the flexible printed circuit board is a chip on film.

In an embodiment, the connection circuit board is a printed wiring board.

In an embodiment, the substrate is a flexible display substrate.

DRAWINGS

DETAILED DESCRIPTION

Figure 1:
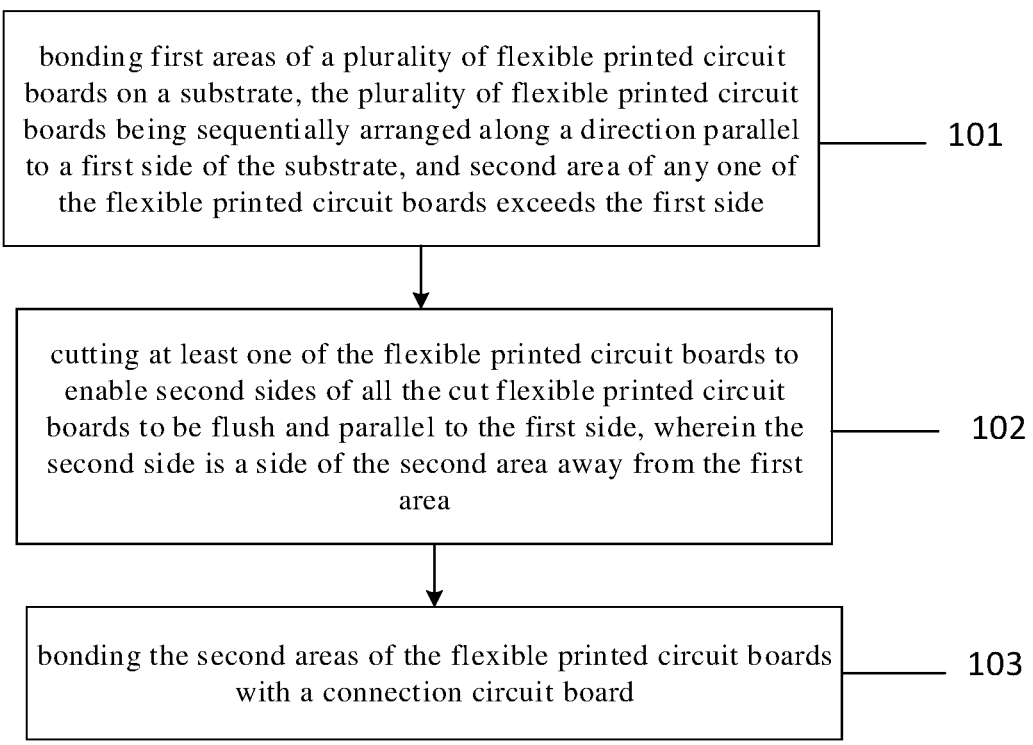
FIG. 1 is a flow chart of an implementation of a bonding method of the present disclosure.

In order that those skilled in the art will better understand the technical solutions of the present disclosure, the following detailed description is given with reference to the accompanying drawings and the embodiments.

The present disclosure will be described in more detail below with reference to the accompanying drawings. Like elements are denoted by like reference numerals throughout the various figures. For purposes of clarity, the various features in the drawings are not drawn to scale. Moreover, certain well-known elements may not be shown in the figures.

Numerous specific details of the present disclosure, such as structures, materials, dimensions, processing processes and techniques of the components, are set forth in the following description in order to provide a more thorough understanding of the present disclosure. However, as will be understood by those skilled in the art, the present disclosure may be practiced without these specific details.

Unless otherwise defined, technical or scientific terms used in the embodiments of the present disclosure should have the ordinary meaning as understood by one of ordinary skill in the art to which the present disclosure belongs. The use of "first", "second" and similar terms in the embodiments of the disclosure is not intended to indicate any order, quantity, or importance, but rather is used to distinguish one element from another.

The word, such as "includes" or "comprises", means that a preceding element or item thereof covers the element or item listed after the word and its equivalent, without excluding other elements or items. The terms "connected" or "coupled" and the like are not restricted to physical or mechanical connections, but may include electrical connections, whether direct or indirect.

In the manufacturing process of a display device in the related art, a bonding process needs to be performed, and the bonding generally includes the following steps: S1, bonding a plurality of flexible printed circuit boards (such as chip on film) on a substrate (such as a display substrate) in sequence; and S2, bonding the flexible printed circuit boards on a connection circuit board. In step S1, due to mechanical errors in the bonding process or deformation of the substrate (particularly, flexible substrate), etc., actual bonding positions of the flexible printed circuit boards are generally shifted, that is, dimensions of the plurality of flexible printed circuit boards beyond the substrate are different.

Figure 5:
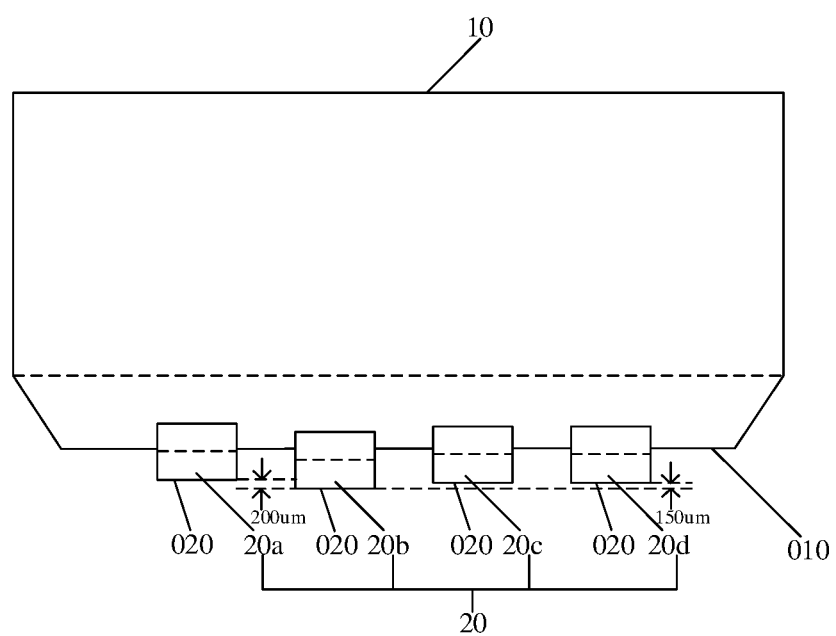
FIG. 5 is a schematic structural diagram illustrating that flexible printed circuit boards are bonded to a substrate in the related art.

For example, as shown in FIG. 5, the dimension of the first flexible printed circuit board 20a beyond a first side 010 of the substrate 10 is the "smallest", while the dimension of the second flexible printed circuit board 20b beyond the first flexible printed circuit board 20a is 200 μm, and the dimension of the third flexible printed circuit board 20c and the fourth flexible printed circuit board 20d beyond the first flexible printed circuit board 20a is 50 μm (i.e., 200 μm–150 μm).

In such way, in step S2, when the plurality of flexible printed circuit boards 20 are bonded on the connection circuit board (for example, a printed circuit board) by taking the first flexible printed circuit board 20a as a reference, a part of the second flexible printed circuit board 20b beyond the first flexible printed circuit board 20a occupies the space of the connection circuit board. However, with the development of display technology, the size of the connection circuit board is smaller and smaller, but the connection circuit board has more and more functions, and thus more limitations on usage of the space of the connection circuit board are required, and the space occupied by each element needs to be compressed, certainly, the space of the connection circuit board for bonding the flexible printed circuit board needs to be smaller and smaller. Therefore, when the plurality of flexible printed circuit boards 20 are bonded to the connection circuit board by taking the first flexible printed circuit board 20a as a reference, the part of the second flexible printed circuit board 20b beyond the first flexible printed circuit board 20a may affect other elements on the connection circuit board.

If the plurality of flexible printed circuit boards 20 are bonded to the connection circuit board by taking the second flexible printed circuit board 20b as the reference, the effective connection area between the first flexible printed circuit board 20a and the connection circuit board will not meet the requirement.

Therefore, bonding the flexible printed circuit boards to the connection circuit board by adopting the bonding method in the related technology easily leads to an unqualified bonding, and the problem of low reliability (RA) of the display device is caused.

In general, a display device (e.g., a flexible organic light emitting diode display device) includes a display substrate and a driving circuit. the display substrate has a display area with a bonding area at a side thereof, the display area has a pixel circuit for displaying an image, and signal lines (e.g., gate lines, data lines, etc.) of the pixel circuit extend to the bonding area. The driving circuit has a connection circuit board on which a driving chip (IC) is integrated. The connection circuit board needs to be connected with the bonding area through the flexible printed circuit boards (FPCs), and signals of the driving chip are transmitted to the pixel circuit through the flexible printed circuit boards so that the display area can display. Specifically, each of the flexible printed circuit boards is provided with a first area and a second area which are oppositely arranged, wherein the first area is to be bonded on the display substrate, and the second area is to be bonded on the connection circuit board so as to realize the electric connection with the driving chip.

As shown in FIGS. 1 to 4, an embodiment of the present disclosure provides a bonding method including steps 101 to 103.

In step 101, the first areas 21 of the flexible printed circuit boards 20 are bonded on a substrate 10, the flexible printed circuit boards 20 are sequentially arranged along a direction parallel to the first side 010 of the substrate 10, and the second area 22 of each of the flexible printed circuit boards 20 exceeds the first side 010.

Figure 2:
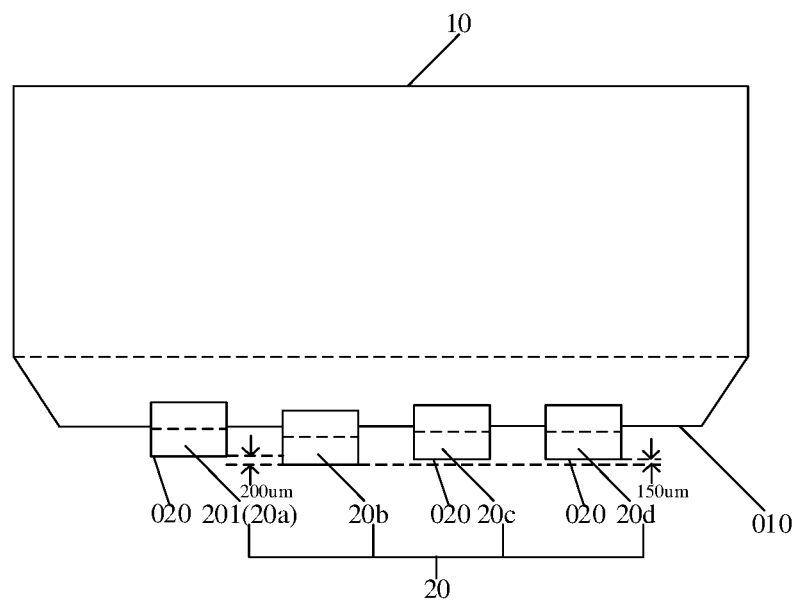
FIG. 2 is a schematic structural diagram illustrating that a plurality of flexible printed circuit boards are bonded to a substrate according to an implementation of the bonding method of the present disclosure.
Figure 3:
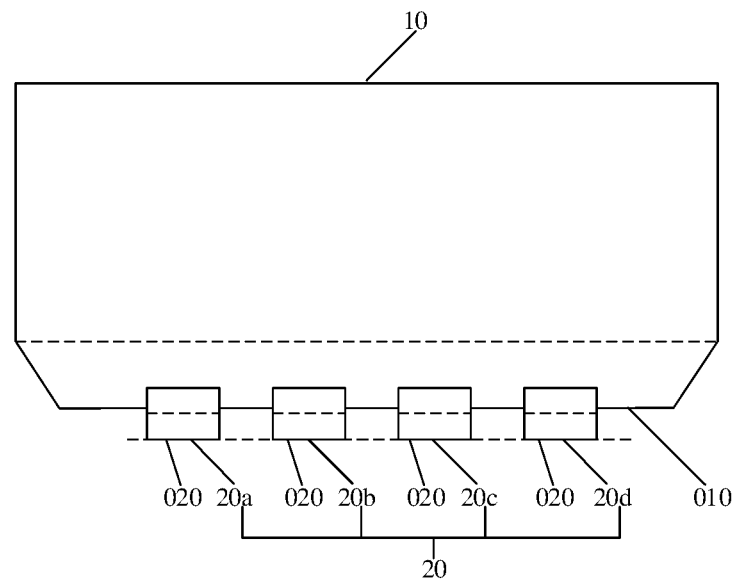
FIG. 3 is a schematic structural diagram illustrating that a plurality of flexible printed circuit boards are cut according to an implementation of the bonding method of the present disclosure.

As shown in FIGS. 2 and 3, the first side 010 of the substrate 10 is an edge of a bonding area (a narrowed area at the lower end of the substrate 10 in the figures) of the substrate 10, and the second area 22 of each flexible printed circuit board (e.g., chip on film COF) 20 exceeding the first side 010 means that the second area 22 (a part of the flexible printed circuit board 20) of each flexible printed circuit board 20 exceeds the edge of the substrate 10, that is, the second area 22 of each flexible printed circuit board 20 extends to outside of the substrate 10, as shown in FIGS. 2 and 3.

It should be understood that the above "exceed" refers to a case where all the flexible printed circuit boards 20 are stretched to the maximum extent in a direction away from the first side 010 and are in a flattened state; meanwhile, "flush", "cut" and the like in the present disclosure also refer to the above case where all the flexible printed circuit boards 20 are in the flattened state.

In step 102, at least one of the flexible printed circuit boards 20 is cut so that the second sides of all the flexible printed circuit boards 20 are flush and parallel to the first side 010, and each of the second sides is an edge of the second area 22 away from the first area 21.

The second side of the flexible printed circuit board 20 is the side of the flexible printed circuit board 20 extending to outside of the substrate 10, and the second side fully exceeds the edge of the substrate 10, as shown in FIG. 2.

End parts of a portion of the flexible printed circuit boards 20 away from the substrate 10 are cut off, obviously, the second side 020 of the flexible printed circuit board 20 is cut off during cutting, but the cut flexible printed circuit board 20 has a "new" second side 020; and the cutting is performed in a manner that the second sides of all the "new" flexible printed circuit boards 20 are flush (or arranged along a straight line) after cutting.

In step 103, the second areas 22 of the flexible printed circuit boards 20 are bonded to the connection circuit board.

That is, the second areas 22 of the flexible printed circuit boards 20 are bonded to the connection circuit board to finish the bonding process.

In this embodiment, before the flexible printed circuit board 20 and the connection circuit board are bonded together, the second sides 020 of the flexible printed circuit boards 20 are flushed by cutting, so that areas of the parts of the flexible printed circuit boards 20 beyond the substrate 10 are the same, and on the premise of the contact area between the flexible printed circuit board 20 and the connection circuit board being ensured, the flexible printed circuit board 20 does not occupy too much area on the connection circuit board.

Figure 4:
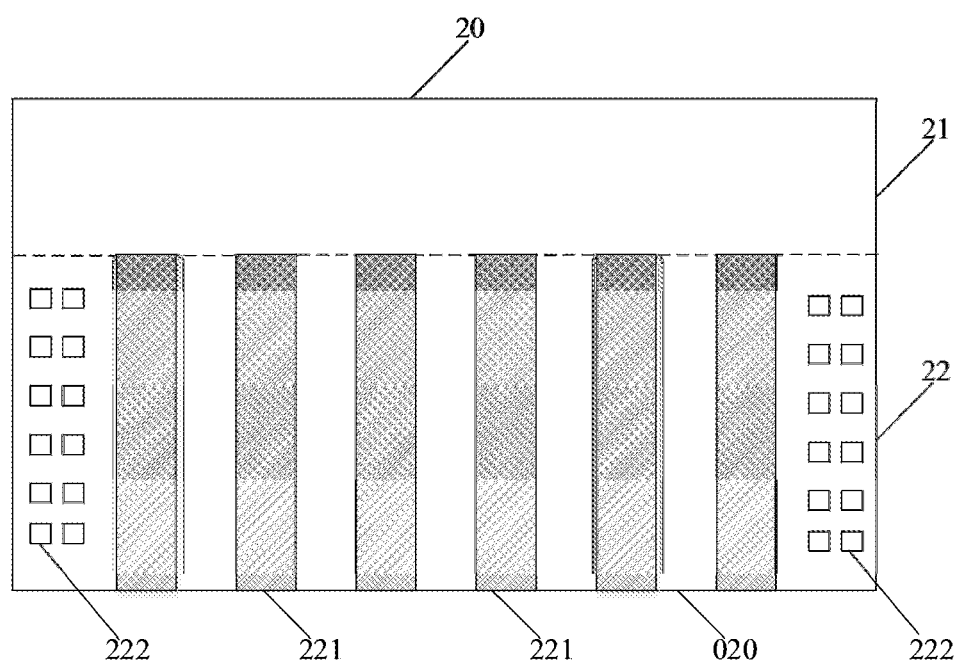
FIG. 4 is a schematic structural diagram of a flexible printed circuit board according to an implementation of the bonding method of the present disclosure.

For example, as shown in FIG. 4, each flexible printed circuit board 20 has a plurality of output pads 221, each output pad 221 extends along a direction perpendicular to the second side 020, and thus the second sides 020 of the flexible printed circuit boards 20 being cut to be flushed means that the output pads 221 on the flexible printed circuit boards 20 being cut to be flushed, so that the contact areas between the output pads 221 of the flexible printed circuit boards 20 and the connection circuit board are equal, and thus, the contact area between each flexible printed circuit board 20 and the connection circuit board meets the requirements, and the flexible printed circuit board 20 does not occupy too much area on the connection circuit board.

As shown in FIGS. 2 and 3, the step 102 may further include a step 102a.

step 102a, cutting by taking an extension line of the second side 020 of the reference flexible printed circuit board 201 as a cutting line so as to enable the second sides 020 of all the flexible printed circuit boards 20 to be flush with the extension line, wherein among the plurality of flexible printed circuit boards 20, a distance from the second side 020 of the reference flexible printed circuit board 201 to the first side 010 of the substrate 10 is the shortest.

The reference flexible printed circuit board 201 is the flexible printed circuit board 20 whose second area 22 exceeds the substrate 10 at least.

In the above solution, the extension line of the second side 020 of the flexible printed circuit board 20 (referred to as the reference flexible printed circuit board 201) whose second area 22 exceeds the substrate 10 at least is taken as the cutting line for cutting, so that the second sides 020 of the plurality of flexible printed circuit boards 20 bonded on the substrate 10 are flush without changing the structure of the flexible printed circuit board 20 in the related art.

For example, FIG. 2 shows that four flexible printed circuits 20 which are a first flexible printed circuit 20a, a second flexible printed circuit 20b, a third flexible printed circuit 20c, and a fourth flexible printed circuit 20d, are sequentially arranged, wherein the distance of the second flexible printed circuit 20b exceeding the first flexible printed circuit 20a is 200 μm, and the distance of the third flexible printed circuit 20c and the fourth flexible printed circuit 20d exceeding the first flexible printed circuit 20a is 50 μm. It can be seen that the second side 020 of the first flexible printed circuit board 20a is closest to the first side 010 of the substrate 10, so that the flexible printed circuit boards 201 are cut by taking the first flexible printed circuit board 20a as the reference flexible printed circuit board 201 in FIG. 2, and FIG. 3 shows a structure after the plurality of flexible printed circuit boards 20 are cut.

Certainly, there may be more than one reference flexible printed circuit board 201, for example, the second sides 020 of two reference flexible printed circuit boards 20 are at the same distance from the first side 010 of the substrate 10, i.e., the second sides 020 of the two reference flexible printed circuit 20 are flush.

In an embodiment, as shown in FIG. 4, the second area 22 of at least one flexible printed circuit 20 has at least one alignment mark 222, and each alignment mark 222 can define a straight line parallel to the second side 020.

In the above solution, the alignment mark 222 on the flexible printed circuit board 20 can define a straight line parallel to the second side 020 of the flexible printed circuit board 20, so that when cutting the flexible printed circuit boards 20 bonded on the substrate 10, a cutting line can be determined by taking the straight line as a reference for cutting, thereby widening the selection range of the cutting line. For example, the position relationship of the alignment marks 222 on different flexible printed circuit boards 20 can indicate the distance relationship between the second sides 020 of different flexible printed circuit boards 20 and the first side 010 of the substrate 10, so that the reference flexible printed circuit board 201 can be conveniently found, and further, the cutting effect (that is, the second sides 020 of all the flexible printed circuit boards 20 are flush), when cutting is performed by taking the extension line of the second side 020 of the reference flexible printed circuit board 201 as a cutting line, is ensured. For another example, the cutting may be performed by taking a straight line defined by a certain alignment mark 222 on a certain flexible printed circuit board 20 as a cutting line, and certainly, the distance from the straight line to the first side 010 of the substrate 10 is smaller than the distance from the second side 020 of any flexible printed circuit board 10 to the first side 010 of the substrate 10.

Certainly, the alignment mark 222 may alternatively indicate the alignment between the flexible printed circuit board 20 and the connection circuit board when the second area 22 of the flexible printed circuit board 20 is bonded to the connection circuit board.

Further, the step 102 may further include a step 102b.

step 102b, cutting by taking the straight line defined by the selected alignment mark 222 as a cutting line, so that the second sides 020 of all the flexible printed circuit boards 20 are flush with the straight line defined by the selected alignment mark 222.

The selected alignment mark 222 at least satisfies the following conditions: a distance from the straight line defined by the alignment mark 222 to the first side 010 of the substrate 10 is not greater than the distance from the second side 020 of any flexible printed circuit board to the first side 010 of the substrate 10.

That is, a certain alignment mark 222 closer to the first side 010 than all the second sides 020 is selected as the selected alignment mark 222, and then cutting is performed along a straight line defined by the selected alignment mark 222, so that all the second sides 020 of the flexible printed circuit boards 20 are flush after cutting.

In the above solution, the straight line defined by the selected alignment mark 222 ensures alignment when cutting the flexible printed circuit boards 20, and ensures cutting effect.

Certainly, there may be not only one selected alignment mark 222, for example, straight lines defined by alignment marks 222 respectively located on two flexible printed circuits 20 may coincide, i.e. a coincidence line is formed, and if the coincidence line is used as the cutting line for cutting, the selected alignment marks 222 are the two alignment marks 222 defining the coincidence line.

In an embodiment, the second area 22 of at least one of the flexible printed circuits 20 has a plurality of alignment marks 222, and different alignment marks 222 of a single flexible printed circuit 20 can define straight lines with different distances to the second side 020 of the flexible printed circuit 20.

In the above solution, different alignment marks 222 of the single flexible printed circuit board 20 can define straight lines with different distances to the second side 020 of the flexible printed circuit board 20, that is, when the flexible printed circuit board 20 is bonded on the substrate 10, different alignment marks 222 located on the flexible printed circuit board 20 can define straight lines with different distances to the first side 010 of the substrate 10. Therefore, the plurality of alignment marks 222 on the flexible printed circuit board 20 broadens the selection range of the cutting lines, and actually broadens the selection range of the distance from the second sides 020 of the flexible printed circuit boards 20 after cutting to the first side 010 of the substrate 10, so that the flexible printed circuit boards 20 can be conveniently cut according to the dimension requirements on the second areas 22 of the flexible printed circuit boards 20 (for example, the minimum dimension required by the second area 22 to effectively bond the flexible printed circuit board 20 to the connection circuit board).

In addition, since the plurality of alignment marks 222 are provided, as long as the cutting is performed not taking the alignment mark 222 closest to the first side 010 as a reference, the alignment mark 222 is inevitably left on the flexible printed circuit board 20 after the cutting, so that the flexible printed circuit board 20 and the connection circuit board can be aligned according to the remaining alignment mark 222, and the accuracy of bonding between the flexible printed circuit board 20 and the connection circuit board is ensured.

In an embodiment, the alignment marks 222 on the single flexible printed circuit board 20 can define a plurality of equally spaced straight lines.

In the above solution, the alignment marks 222 on the single flexible printed circuit board 20 can define a plurality of equally spaced straight lines, and then the alignment marks 222 on the single flexible printed circuit board 20 are equivalent to scale marks, and the distance from the straight line defined by each alignment mark 222 to the first side 010 of the substrate 10 can be indicated more accurately, so that the alignment mark 222 can be selected more conveniently.

In an embodiment, the alignment marks 222 on the single flexible printed circuit board 20 are sequentially arranged along a straight line perpendicular to the second side 020.

In the above solution, the alignment marks 222 on the single flexible printed circuit board 20 are arranged in a row in a direction (the direction perpendicular to the second side 020), so that the distance from the straight line defined by each alignment mark 222 to the first side 010 of the substrate 10 can be determined more intuitively and more quickly, and thus, it can be determined more conveniently that which one (or ones) of the straight lines defined by the alignment marks 222 can be used as the cutting line.

Specifically, in an embodiment, as shown in FIG. 4, each alignment mark 222 may be a pair of rectangular patterns (two-dimensional patterns) with the same size and located in a same row, and when the flexible printed circuit board 20 is cut, the sides of the selected pair of rectangle patterns close to the first side 010 of the substrate 10 may be selected as the cutting line, or the sides of the selected pair of rectangle patterns away from the first side 010 of the substrate 10 may be selected as the cutting line. Certainly, the alignment marks 222 may be other patterns as long as they can define straight lines, for example, each alignment mark 222 may be two isosceles triangles with the same size and located in a same row. Certainly, the alignment mark 222 may alternatively be a three-dimensional pattern, for example, the alignment mark 222 is a convex pattern.

In an embodiment, as shown in FIG. 4, the second area 22 of each flexible printed circuit board 20 has a plurality of output pads 221, and the plurality of output pads 221 are sequentially arranged along a direction parallel to the second side 020.

Each of the output pads 221 extends along a direction perpendicular to the second side 020, i.e. each of the output pads 221 extends along a direction in which the second area 22 of the flexible printed circuit board 20 extends beyond the first side 010 of the display substrate 10.

Therefore, in the above solution, the cutting of the second area 22 of the flexible printed circuit board 20 is substantially to cut the output pads 221 located in the second area 22 of the flexible printed circuit board 20, that is, cutting the flexible printed circuit boards 20 to be flush are substantially to cut the output pads 221 on the flexible printed circuit boards 20 to be flush, so that the effective electrical contact areas between the flexible printed circuit boards 20 and the connection circuit board are the same.

Further, in the direction perpendicular to the second side 020, each of the output pads 221 is throughout the second area 22, i.e., a length of each of the output pads 221 in the direction perpendicular to the second side 020 is equal to a length of the second area 22 in the direction perpendicular to the second side 020.

In the above solution, since each of the output pads 221 is throughout the second area 22, the output pads 221 on the plurality of flexible printed circuit boards 20 can be flush after the cutting regardless of whether the cutting is performed by taking the extension line of the second side 22 of the flexible printed circuit board 201 as the cutting line or by taking the straight line defined by the selected alignment mark 222 as the cutting line.

In an embodiment, a plurality of flexible printed circuit boards 20 are bonded to a single connection circuit board.

The larger the size of the substrate 10 (e.g., 4K, 8K substrate 10) is, the larger the dimension of the first side 010 thereof is, and thus the more flexible printed circuit boards 20 are bonded thereto. Therefore, if each of the flexible printed circuit boards 20 is connected to a separate connection circuit board, the number of connection circuit boards will be too many, and it is difficult to arrange; therefore, a plurality of flexible printed circuit boards 20 may be connected with a single connection circuit board.

In an embodiment, the flexible printed circuit board 20 is a chip on film.

The chip on film (COF) is a flexible printed circuit board capable of packaging chips.

In the above solution, since the chip on film is a flexible printed circuit board 20 with high reliability and excellent flexibility, it can be well bonded with the substrate 10 and the connection circuit board.

In an embodiment, the connection circuit board may be a printed circuit board (PCB).

In general, a printed wiring board is used as a carrier of a driving chip in a display device.

In an embodiment, the substrate 10 may be a flexible display substrate 10.

In general, the flexible display substrate 10 is thin and sensitive to pressure, is easily deformed when being stressed, is sensitive to temperature, and is easily thermally expanded when being heated. However, the flexible printed circuit board 20 (e.g., COF) and the substrate 10 are generally bonded together by thermocompression bonding. Therefore, it is very probably that the second sides 020 of the plurality of flexible printed circuit boards 20 bonded to the flexible display substrate 10 are not in a straight line due to different deformations and different thermal expansion values at different positions of the flexible display substrate 10.

Therefore, the display device having the flexible display substrate 10 adopts the bonding method of the embodiment to bond the flexible display substrate 10, the flexible printed circuit board 20 and the connection circuit board together, so as to improve the bonding effect of the flexible display substrate 10 and the connection circuit board, thereby improving the reliability of the display device.

The embodiments of the present disclosure at least partially solve the problem that the bonding method in the related art is likely to cause unqualified bonding between the flexible printed circuit board and the connection circuit board, thereby causing low reliability of the display device, and thus the flexible printed circuit board occupies less space of the connection circuit board on the premise of ensuring the effective bonding area between the flexible printed circuit board and the connection circuit board.

It should be noted that, in this document, relational terms such as first and second are used solely to distinguish one entity or action from another entity or action without necessarily requiring or implying any actual such relationship or order between such entities or actions. Furthermore, the terms "comprises", "includes" or any other variation thereof, are intended to cover a non-exclusive inclusion, such that a process, method, article, or apparatus that comprises a list of elements include not only these elements but also other elements not expressly listed or inherent to such process, method, article, or apparatus. Without further limitation, an element defined by the phrase "comprising a . . . " does not exclude the presence of other identical elements in the process, method, article, or apparatus that comprises the element.

In accordance with the disclosed embodiments, as described above, these embodiments are not intended to be exhaustive or to limit the invention to the precise embodiments disclosed. Obviously, many modifications and variations are possible in light of the above teaching. The embodiments were chosen and described in order to best explain the principles of the disclosure and the practical application, to thereby enable others skilled in the art to best utilize the disclosure and various embodiments with various modifications based on the disclosure. The present disclosure is to be limited only by the claims and their full scope and equivalents.

The invention claimed is:

1. A bonding method, comprising:
    bonding first areas of a plurality of flexible printed circuit boards on a substrate, the plurality of flexible printed circuit boards being sequentially arranged along a direction parallel to a first side of the substrate, and a second area of each of the flexible printed circuit boards exceeds the first side;
    cutting at least one of the flexible printed circuit boards to enable second sides of all the flexible printed circuit boards to be flush and parallel to the first side, wherein each of the second sides is a side of the second area away from the first area; and
    bonding second areas of the flexible printed circuit boards with a connection circuit board, wherein
    the cutting at least one of the flexible printed circuit boards comprises:
    cutting by taking an extension line of the second side of a reference flexible printed circuit board as a cutting line so as to enable all the second sides of the flexible printed circuit boards to be flush with the extension line after cutting, wherein among the flexible printed circuit boards, a distance form the second side of the reference flexible printed circuit board to the first side of the substrate is the shortest.

2. The bonding method according to claim 1, wherein the plurality of flexible printed circuit boards are bonded to a single connection circuit board.

3. The bonding method according to claim 1, wherein the flexible printed circuit board is a chip on film.

4. The bonding method according to claim 1, wherein the connection circuit board is a printed wiring board.

5. The bonding method according to claim 1, wherein the substrate is a flexible display substrate.

6. A bonding method, comprising:
    bonding first areas of a plurality of flexible printed circuit boards on a substrate, the plurality of flexible printed circuit boards being sequentially arranged along a direction parallel to a first side of the substrate, and a second area of each of the flexible printed circuit boards exceeds the first side;
    cutting at least one of the flexible printed circuit boards to enable second sides of all the flexible printed circuit boards to be flush and parallel to the first side, wherein each of the second sides is a side of the second area away from the first area; and
    bonding second area of the flexible printed circuit boards with a connection circuit board, wherein
    the second area of at least one of the flexible printed circuit board is provided with at least one alignment mark, and each alignment mark defines a straight line parallel to the second side.

7. The bonding method according to claim 6, wherein the cutting at least one of the flexible printed circuit boards comprises:
    cutting by taking a straight line defined by a selected alignment mark as a cutting line, so that the second sides of all the flexible printed circuit boards are flush with the straight line defined by the selected alignment mark.

8. The bonding method according to claim 6, wherein the second area of at least one of the flexible printed circuit boards is provided with a plurality of alignment marks, and different alignment marks of a single flexible printed circuit board defines straight lines with different distances to the second side of the flexible printed circuit board.

9. The bonding method of claim 8, wherein the plurality of alignment marks on the single flexible printed circuit board define a plurality of straight lines which are equally spaced.

10. The bonding method of claim 8, wherein the plurality of alignment marks on the single flexible printed circuit board are sequentially arranged along a straight line perpendicular to the second side.

11. The bonding method according to claim 1, wherein the second area of each of the flexible printed circuit boards is provided with a plurality of output pads which are sequentially arranged along the direction parallel to the second side.

12. The bonding method of claim 11, wherein each of the output pads is throughout the second area in a direction perpendicular to the second side.

* * * * *